United States Patent
Kim et al.

(10) Patent No.: US 7,029,593 B2
(45) Date of Patent: Apr. 18, 2006

(54) METHOD FOR CONTROLLING CD DURING AN ETCH PROCESS

(75) Inventors: Myeong-Cheol Kim, Suwon-si (KR); Yong-Hoon Kim, Anyong-si (KR); Jeong-Yun Lee, Yongin-si (KR)

(73) Assignee: Samsung Electronics Co., Ltd,, Kyungki-do (KR)

( * ) Notice: Subject to any disclaimer, the term of this patent is extended or adjusted under 35 U.S.C. 154(b) by 183 days.

(21) Appl. No.: 10/685,032

(22) Filed: Oct. 14, 2003

(65) Prior Publication Data

US 2004/0079722 A1    Apr. 29, 2004

(51) Int. Cl.
*G05D 5/00* (2006.01)

(52) U.S. Cl. .............. 216/59; 216/67; 438/5; 438/8; 438/9; 438/714; 430/313

(58) Field of Classification Search .......... 216/59, 216/67; 438/5, 8, 9, 714; 430/5, 313
See application file for complete search history.

(56) References Cited

U.S. PATENT DOCUMENTS

| 6,322,714 B1* | 11/2001 | Nallan et al. ............ 216/67 |
| 6,350,390 B1* | 2/2002 | Liu et al. .................. 216/59 |
| 6,727,047 B1* | 4/2004 | Montgomery et al. ..... 430/322 |

FOREIGN PATENT DOCUMENTS

| KR | 199923359 | 3/1999 |
| KR | 20017450 | 1/2001 |

\* cited by examiner

*Primary Examiner*—Shamim Ahmed
(74) *Attorney, Agent, or Firm*—F. Chau & Associates, LLC

(57) ABSTRACT

A method for controlling CD of etch process defines difference between designed dimension and etched dimension as dimensional displacement and defines target value of the dimensional displacement. A plurality of samples are prepared in each group having different exposure ratios. The plurality of samples of each group are etched until etch end point is detected and then over-etched for uniform time interval after detecting the etch end point. Using etch end point and over-etch time, correlation function of the over-etch time to the etch end point time is determined and the over-etch time to the etch end point is determined using the correlation function.

9 Claims, 7 Drawing Sheets ions of opaque material from etched regions. The over-etch time is applied to an etching process in proportion to the EPD time. When the exposure ratio is low, EPD time is short because there is less opaque material as compared to photo masks having high exposure ratios. Therefore, the photoresist pattern sustains less etching damage during an etch process for forming an opaque pattern 4a. Further, the dimensional displacement L12, which is a difference between designed CDs L1 and etched CDs L2, is small.

METHOD FOR CONTROLLING CD DURING AN ETCH PROCESS

BACKGROUND OF THE INVENTION

1. Field of the Invention

The present invention relates to a method of forming semiconductor devices, and more specifically to a method of accurately controlling critical dimension (CD) in an etch process.

2. Discussion of Related Art

In a process for forming a semiconductor device, an etch process is used to form a pattern on a substrate. The etch process includes forming a photo mask, which transcribes the pattern into a semiconductor substrate, forming a material pattern on the semiconductor substrate. As patterns of the semiconductor device become more intricate, the accuracy with which the designed pattern is transcribed onto the substrate needs to increase. However, according to the properties of a layer, such as material thickness and exposure ratio, the pattern may be formed on the substrate having a different shape than the designed pattern. Further, an etch rate and a difference between the critical dimensions (CDs) of the etched pattern and designed pattern (i.e., dimensional displacement) may vary between different devices. A deformity of the pattern may be corrected by simulation or experimental pattern fitting. However, it is difficult to predict the dimensional displacement because the dimensional displacement is closely related to the exposure ratio. The exposure ratio is defined as a proportion of an area of an etched region to an area of the entire surface. It is difficult to measure the exposure ratio accurately, due to the complexity of patterns. In addition, conventional etch processes typically control CD using a sampling test. Thus, when intricate patterns are fabricated, samples for improving the etch method may be insufficient, such that CD cannot be accurately controlled. Even when a large number of devices are fabricated, it is difficult to precisely control CD because an etching aspect of different devices varies depending on the conditions of a preceding process, device, and etchant.

FIGS. 1A and 1B are schematic top plane views showing photo masks used for a photolithography process.

FIGS. 2A and 2B are cross-sectional views showing a method for forming the photo masks of FIGS. 1A and 1B.

Referring to FIGS. 1A and 1B, a photo mask comprises a transparent substrate 2 and opaque material patterns 4a and 4b. The opaque material patterns 4a and 4b are formed of a material such as chrome. A photo mask may have various ratios of opaque regions 4a and 4b and exposure regions 6a and 6b as occasion demands. Referring to FIG. 1A, a majority of the transparent substrate 2 is covered with opaque material 4a, such that the exposure ratio of region 6a is relatively low. Referring to FIG. 1B, however, the exposure ratio of region 6b is relatively high as compared to the photo mask of FIG. 1A. The two photo masks may be formed exhibiting different etching aspects depending on an exposure ratio in a fabrication process. In order to fabricate the photo mask, an opaque material and a photoresist pattern are formed on a transparent substrate 2. The opaque material is etched according to the photoresist pattern to form the opaque material patterns 4a and 4b.

When a photo mask pattern having low exposure ratio is formed as illustrated in FIG. 2A, a photoresist pattern 8a formed on the transparent pattern 2 is etched during etching of the opaque material, thereby forming a deformed photoresist pattern 10a. The opaque material is etched during end point detection (EPD) time and over-etched during a pre-determined time to remove any remaining opaque material from etched regions. The over-etch time is applied to an etching process in proportion to the EPD time. When the exposure ratio is low, EPD time is short because there is less opaque material as compared to photo masks having high exposure ratios. Therefore, the photoresist pattern sustains less etching damage during an etch process for forming an opaque pattern 4a. Further, the dimensional displacement L12, which is a difference between designed CDs L1 and etched CDs L2, is small.

Referring to FIG. 2B, when a photo mask pattern having a relatively high exposure ratio is formed, a comparatively large amount of opaque material is etched. Therefore, the EPD time and over-etch time are relatively long, and a photoresist pattern 8b is eroded. The etch process for forming the opaque pattern 4b is relatively long, and the sidewalls of the photoresist pattern 8b are eroded. Thus, the photoresist pattern 10b has a large difference between the designed CD L3 and the etched CD L4.

As stated above, the dimensional displacement of the photo mask pattern varies according to the exposure ratio. Variations in CD are difficult to predicted prior to performing the etching process because photo masks typically have unique patterns. Further, etching aspects vary depending on process conditions such as device parameters, etchant, preliminary process, and material layers used in the etching process. Therefore, an accurate pattern can be difficult to achieve if an over-etch time is linearly proportional to EPD time or if an experimentally achieved time is uniformly applied.

SUMMARY OF THE INVENTION

According to an embodiment of the present invention, a method obtains a uniform dimensional displacement independent of exposure ratio.

According to another embodiment of the present invention, a method of obtaining uniform dimensional displacement is insensitive to process variables.

According to still another embodiment of the present invention, a method accurately forms a desired pattern.

The present invention therefore provides a method of controlling a CD of a pattern by applying an over-etch time corresponding to an EPD time. The method comprises following steps.

A difference between a designed dimension and an etched dimension is defined as a dimensional displacement, and a target value of the dimensional displacement is determined. A plurality of samples are classified into groups according to exposure ratio. Each sample is etched until etch end point is detected and over-etched for a predetermined time after the etch end point is detected. In each group, the over-etch times applied to each sample are not identical. That is, the over-etch times applied to different samples are gradually increased by a regular interval. The dimensional displacement of every sample is determined and an EPD time and an over-etch time are selected where the target value is obtained for each group. Using the EPD times and the over-etch times, which are selected from every group, a correlation function of EPD time to over-etch time is determined. The correlation function is useful for determining an over-etch time in an actual etching process. In an actual etching process, the over-etch time is determined by substituting the EPD time into the correlation function.

In preparing the samples, the exposure ratio is varied and groups of samples are classified according to the exposure ratio. Each group comprises a plurality of samples. In addition, the EPD time may be detected by an end point detector, and the over-etch time may be determined by subtracting the EPD time from a total etch time.

Specifically, a designed dimension of each group is measured and the samples of each group are etched, varying the total etch time for each sample. After the samples are etched, a dimensional displacement is determined in each group according to each etch time. A total etch time corresponding to each group is selected that results in the dimensional displacement being substantially identical to the target value. The over-etch time can be obtained by subtracting the EPD time from the selected total etching time.

In addition, a relation between the selected EPD times and corresponding over-etch times is determined and the correlation function is determined from the relationship. In the actual etching process, the correlation function may be used by an etching apparatus as an over-etching control function. That is, when EPD is detected, a corresponding over-etch time is determined using the correlation function of the over-etching control function. An over-etching process may be performed during the determined over-etch time.

According to an embodiment of the present invention, an etching apparatus for controlling a critical dimension, comprises a processor for executing code defining a correlation function of end point time to over-etch time, the correlation function determining an over-etch time corresponding to the end point time. The correlation function is defined according to a difference between a designed dimension and an etched dimension as a dimensional displacement.

A target value of the dimensional displacement is specified. A plurality of samples are classified into groups according to exposure ratio and the samples of each group are etched until an etch end point is detected and over-etching the samples of each group for different times according to a uniform time interval. An end point detection time and an over-etch time of each group is selected according to the target value of the dimensional displacement.

The etching apparatus further comprises an optical emission spectrometer for detecting the end point.

BRIEF DESCRIPTION OF THE DRAWINGS

The above and other features and advantages of the present invention will become readily apparent from the description that follows, with reference to the accompanying drawings, in which.

DETAILED DESCRIPTION OF PREFERRED EMBODIMENTS

Figure 1A:
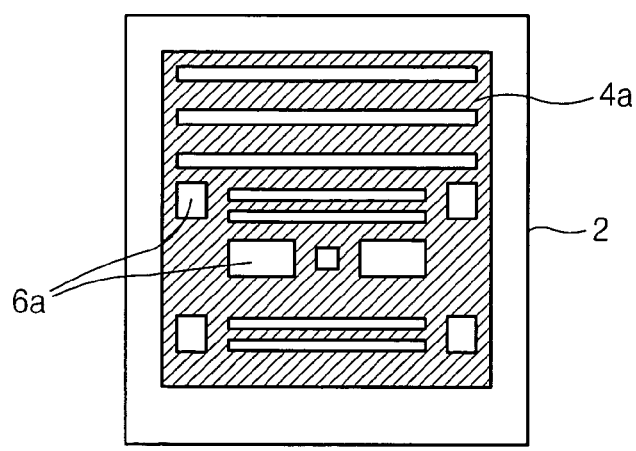
FIGS. 1A and 1B are schematic top plane views showing photo mask used for the photolithography.
Figure 1B:
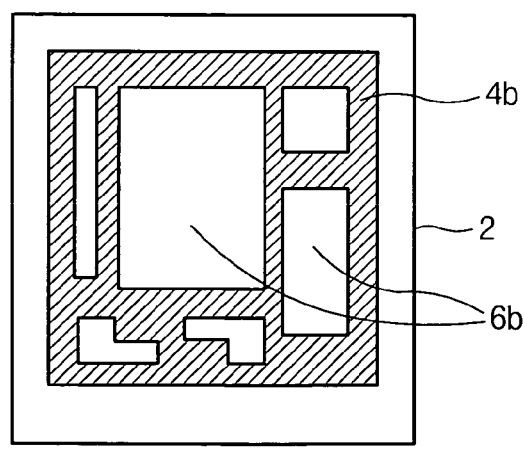
Figure 2A:
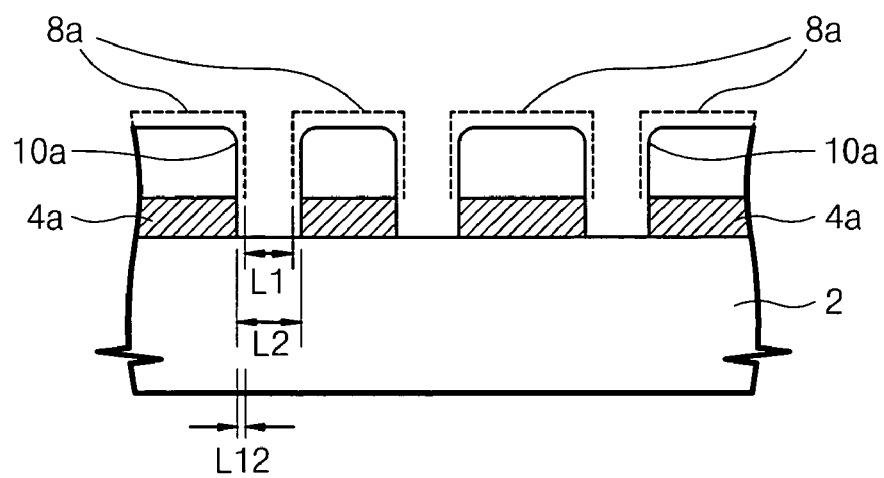
FIGS. 2A and 2B are cross-sectional views respectively showing methods of FIGS. 1A and 1B.
Figure 2B:
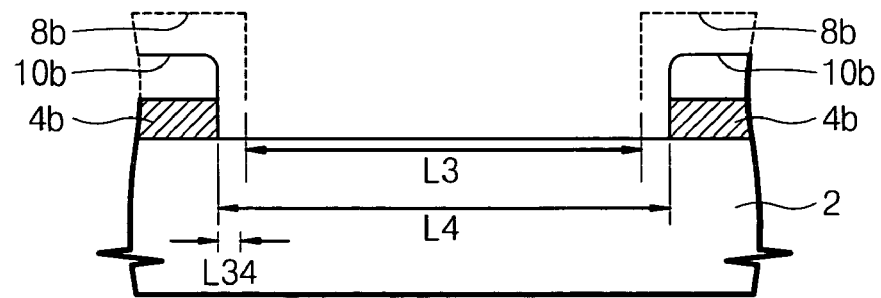

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Like numbers refer to like elements throughout.

Figure 3A:
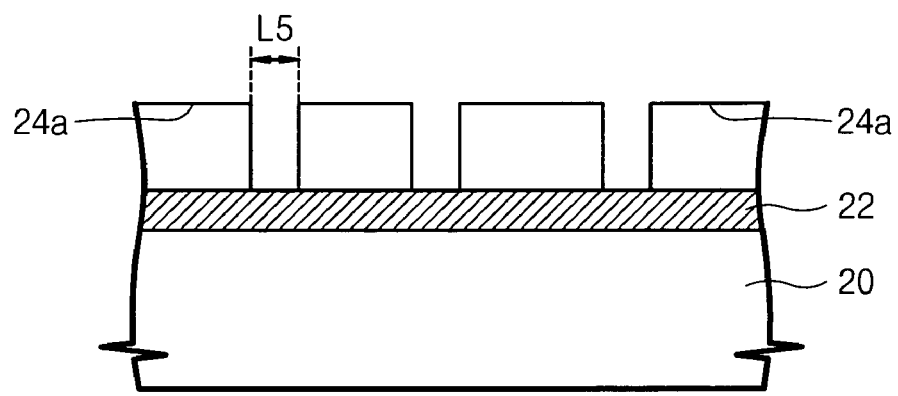
FIGS. 3A and 4A are cross-sectional views showing a process of achieving a dimensional displacement of a first group that has low exposure ratio.
Figure 4A:
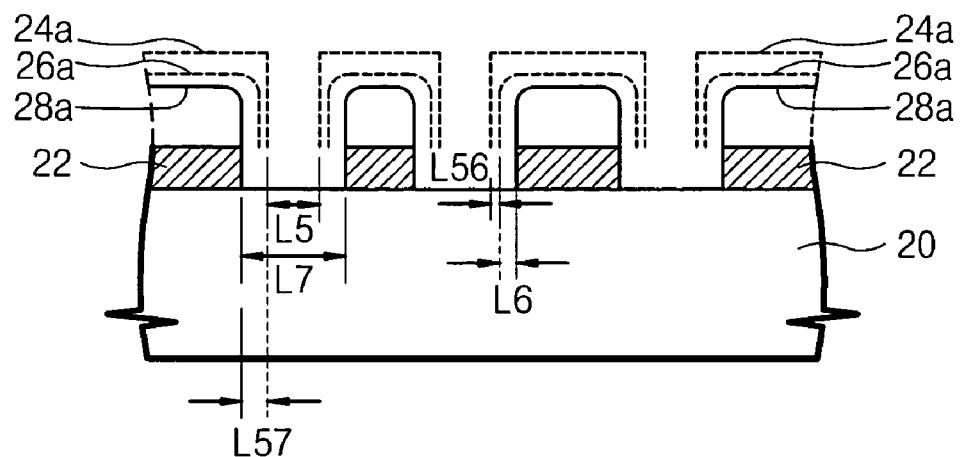

FIGS. 3A and 4A are cross-sectional views showing a process of achieving a dimensional displacement of a first group of devices with low exposure ratios.

Figure 3B:
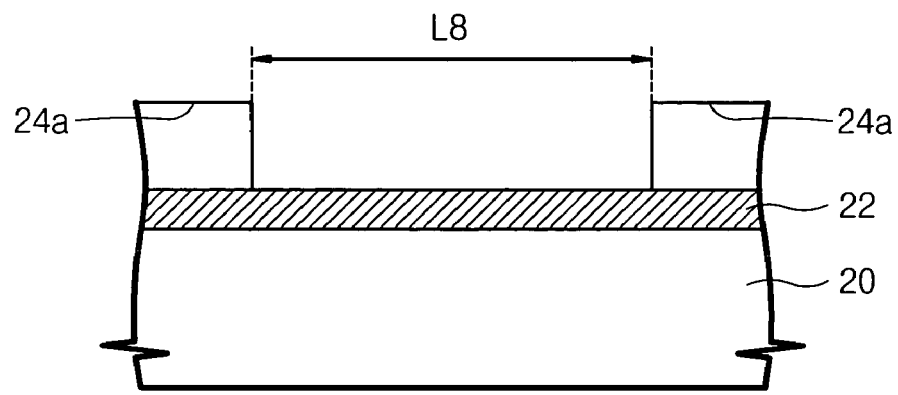
FIGS. 3B and 4B are cross-sectional views showing a process of achieving a dimensional displacement of a second group that has high exposure ratio.
Figure 4B:
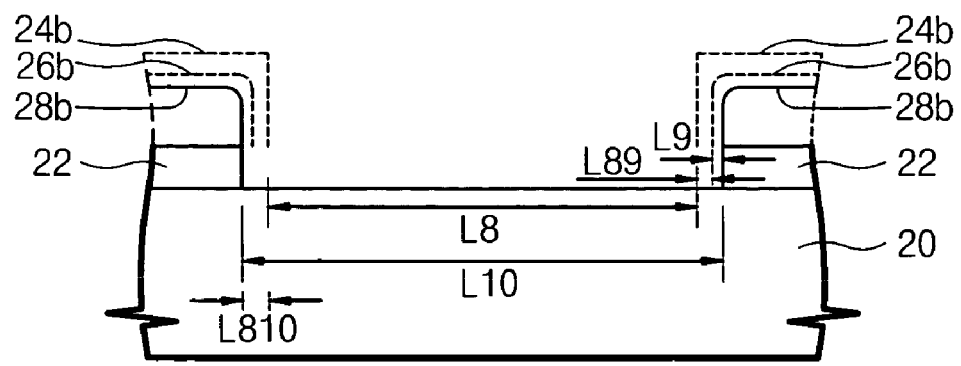

FIGS. 3B and 4B are cross-sectional views showing a process of achieving a dimensional displacement of a second group of devices with high exposure ratios.

To achieve a desired dimensional displacement, different groups of devices having different exposure ratios are prepared. Each group comprises a plurality of samples and the samples of a group have substantially identical exposure ratios. Differences in the exposure ratios between the groups increase or decrease at a substantially identical interval. For example, if the exposure ratio of the first group is 10%, second and third groups may have gradually increased exposure ratios. That is, the second becomes 20% and the third becomes 30%. In addition, to determine the exposure ratio accurately, substantially identical patterns may be formed repeatedly on the substrate. Alternatively, various patterns may be formed at different regions on a substrate. As the number of groups becomes larger smaller intervals may be used and more accurate data can be achieved.

Referring to FIG. 3A, a material layer 22 is formed on a substrate 20. A first photoresist pattern 24a is formed on the material layer 22. The first photoresist pattern 24a has a first designed dimension L5 having a narrow exposed region.

Referring to FIG. 3B, the material layer 22 is formed on the substrate 20. A second photoresist pattern 24b is formed on the material layer 22. Exposed regions of the second photoresist pattern 24b have a second designed dimension L8 wider than that of the first photoresist pattern 24a. The substrate 20 may be transparent and the material layer 22 may be an opaque layer. In the exemplary embodiment, two groups are described, however a plurality of groups having different exposure ratios can be prepared to achieve accurate data.

Referring to FIG. 4A, using the first photoresist pattern 24a as an etch mask, the material layer 22 is etched. In this case, different etching times are applied to each sample in a group. To achieve dimensional displacement independent of exposure ratio, a target dimensional displacement is determined. The samples are etched for various etching times, thereby obtaining data on different achieved dimensional displacements. With analysis of the data, a total etching time can be determined that achieves the target value for dimensional displacement. In the exemplary embodiment, the CD may be defined by a distance between patterns. In case of the first group having low exposure ratio, an end point detection (EPD) time measured by the end point detector is too short to reduce etching damage to the first photoresist pattern 24a. Therefore, after detecting the etch end point, the difference L56 between etched CDs of the first photoresist pattern 26a and the designed CDs of first photoresist pattern 24a is relatively small. In case of a photo mask having a low exposure ratio, the dimensional displacement L6 of the first photoresist pattern 28a, from the moment the end point is detected until the time etching is completed, is larger than the dimensional displacement L56 from the etch starting time to the EPD time.

Referring to FIG. 4B, when the exposure ratio is high, a relatively large amount of the material layer is removed. Therefore, the EPD time needs to be relatively long, and thus etching damage increases and the shape of the photo resist pattern is further transformed, as compared to when the exposure ratio is low. The samples of the second group, similar to the samples of the first group, may be etched for various etching times to achieve dimensional displacement data. Total etch time may be determined to obtain the target value of dimensional displacement by analyzing the dimensional displacement data.

As illustrated in FIG. 4B, using the second photoresist pattern 24b as an etch mask, the material layer 22 is etched. The end point detector measures an end point. The difference L810 between designed CD L8 of the second photoresist pattern 24b and an etched CD L10 is relatively large as compared to that of the first group. Therefore, the target value of dimensional displacement may be achieved from a sample having a shorter over-etch time after detecting the end point. The dimensional displacement L9 caused by over-etching may be smaller than the dimensional displacement L89 caused by etching until the EPD time. The target value may be adjusted according to the achieved dimensional displacement data. The over-etch time should be long enough to prevent residue from remaining at a region where a material layer should be removed.

As stated above, the dimensional displacement of a pattern relates to the etching damage of the photoresist pattern. That is, as the etching time becomes longer, sidewalls of the photoresist pattern are etched further. Thus, according to an embodiment of the present invention, the over-etch time is decreased as the EPD time becomes longer, and the over-etch time is increased as the EPD time becomes shorter. This can be accomplished by determining a correlation function of EPD time to over-etch time, and by determining an over-etch time from the correlation function.

Figure 5:
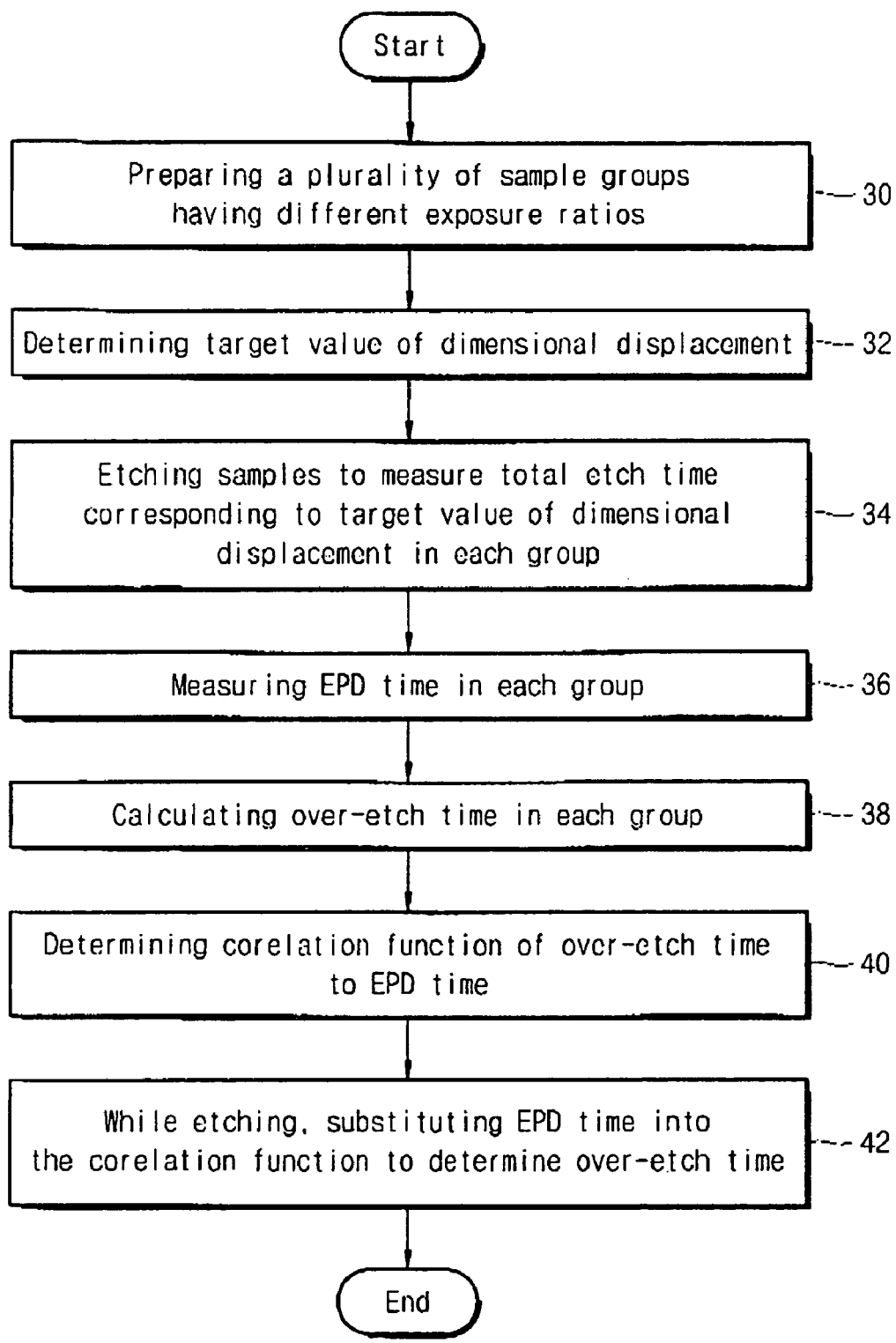
FIG. 5 is a flowchart showing a method of controlling CD in accordance with an exemplary embodiment of the present invention.

FIG. 5 is a flowchart showing a method of controlling CD in accordance with an exemplary embodiment of the present invention.

Figure 6:
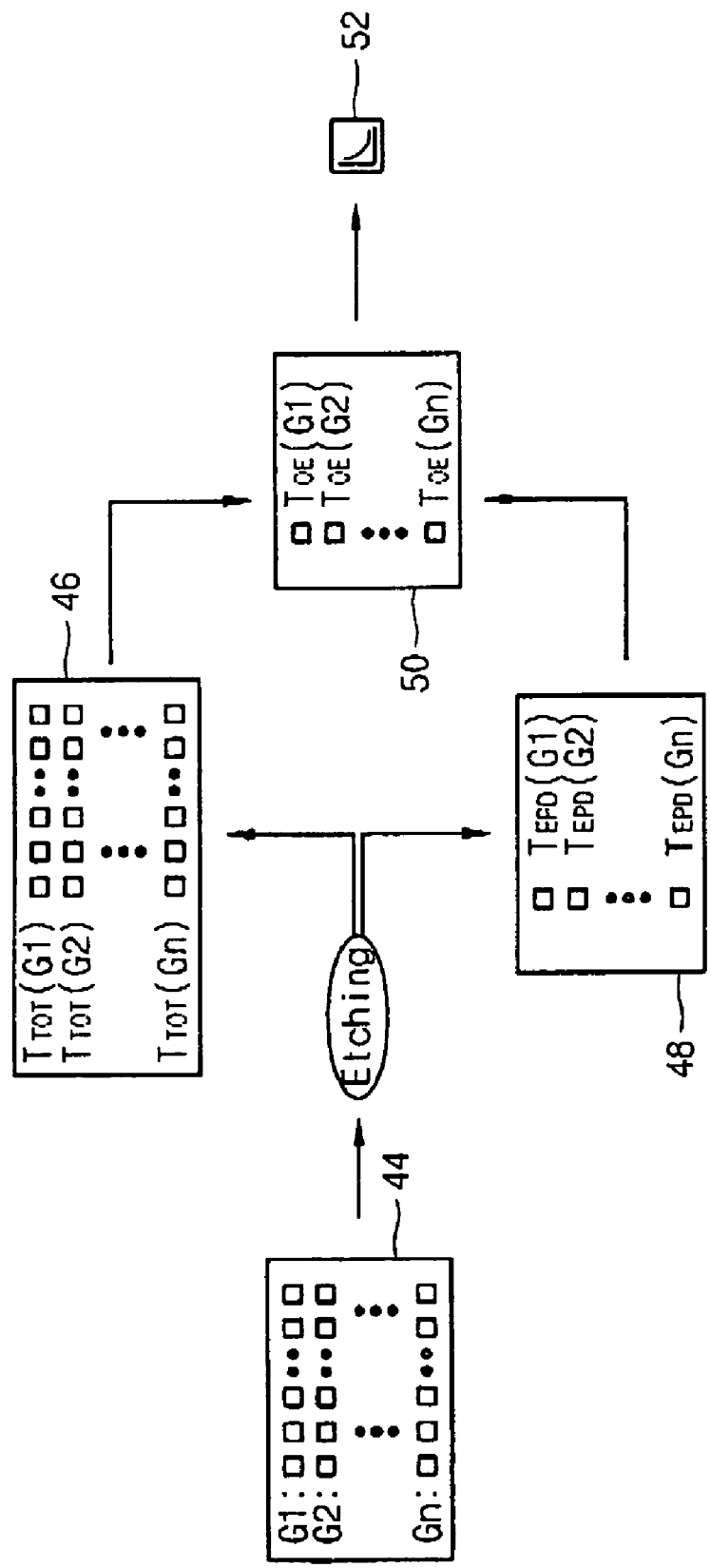
FIG. 6 is a block chart showing a method of controlling CD in accordance with an exemplary embodiment of the present invention.

FIG. 6 is a block chart showing a method of controlling CD in accordance with an exemplary embodiment of the present invention.

Referring to FIG. 5, in a step 30, a plurality of groups are prepared. The groups are classified according to exposure ratio. Each of the groups comprises a plurality of samples. The samples may have substantially identical patterns that are alternately repeated on a substrate, such that an exposure ratio can be accurately measured. As illustrated in FIGS. 3A and 3B, the samples have various CDs according to exposure ratios.

In a step 32, a target value of dimensional displacement is determined. The dimensional displacement may be defined as difference between a designed CD and an etched CD. The target value may be larger than the dimensional displacement when the etch process is performed to prevent undesirable residue from remaining on an etched region.

In a step 34, each sample is etched and a total etch time and a dimensional displacement are determined. In each group, a total etch time corresponding to the target value is selected. Specifically, n groups are prepared, each group comprising m samples, and a designed CD of every sample is measured. Then, material layers of the m samples are etched for different etch times. The etch time should be longer than the EPD time. When the etch process is completed an etched CD of each sample is measured. The design dimension and the etched CD are compared to each other to determine the dimensional displacement. As a result, a relation between the total etch time and the dimensional displacement can be obtained. The total etch time can be determined as the etch time where the determined dimensional displacement is substantially similar to the target value.

In steps 36 and 38, the EPD time corresponding to the target value is determined for each group. An over-etch time is determined from the EPD time and the total etch time corresponding to the target value.

Figure 7:
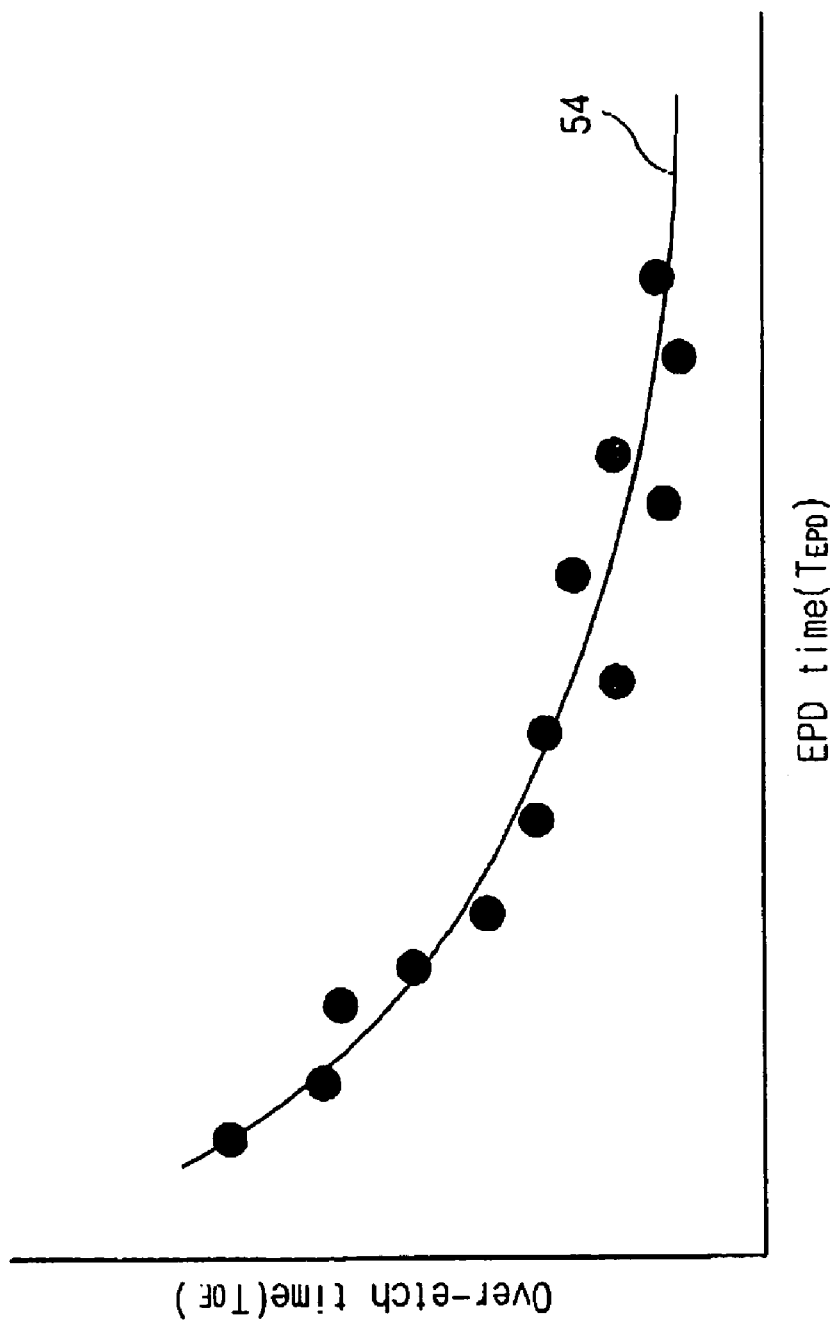
FIG. 7 is a graph of end point detect time to total etch time.

In a step 40, a correlation function of over-etch time and EPD time is determined using the determined over-etch time and the measured EPD time. The correlation function may be attained from the relation graph of FIG. 7. FIG. 7 shows relationship between over-etch time and EPD time when a dimensional displacement exhibits the target value in each group.

The axis of ordinates shows over-etch time and the axis of abscissas shows EPD time. Each point exhibits an over-etch time and an EPD time when a dimensional displacement is substantially identical with the target. Fitting a curve to the points, such as by interpolation, may be used to obtain a correlation function of over-etch time to EPD time from the graph. As illustrated in FIG. 7, over-etch time is inversely proportional to EPD time, so that a uniform dimensional displacement is obtained regardless of exposure ratio.

In a step 42, EPD time is used by the correlation function, thereby determining an over-etch time for an actual etching process. The exposure ratio is reflected in the EPD time, such that a desired over-etch time can be determined by substituting the EPD time into the correlation function. An etching apparatus includes an end point detector and a microprocessor for controlling etch process. Therefore, the correlation function controls commands that manage etch process. The EPD time is applied to the correlation function to determine an over-etch time after the end point detector detects an etch end point. The over-etch time is applied to the etching process to control CD displacement.

Referring to FIG. 6, a control method of CD according to present invention will be explained hereinafter. Referring to 44 of FIG. 6, n groups (G1~Gn) are prepared that comprise a plurality of samples, respectively. Exposure ratio of each of the group is different. The samples are etched. The samples of each group are etched for different etch times. Referring to 46 of FIG. 6, one of samples is selected from each group. The selected samples are identical or approximate to the predetermined target value of dimensional displacement. An etch time corresponding the target value $T_{TOT}(Gn)$ is selected from the selected sample in each group. Referring to 48 of FIG. 6, an EPD time $T_{EPD}(Gn)$ that corresponds to the target value is selected from the selected sample in each group. Over-etch time $T_{TOE}(Gn)$ may be determined from the EPD time $T_{EPD}(Gn)$ and the etch time $T_{TOT}(Gn)$ in each group. The over-etch time $T_{TOE}(Gn)$ is an additional etch time after an etch end point is detected, thereby being defined as follows.

Over-etch time $T_{OE}(Gn)$ is, $$T_{OE}(Gn) = T_{TOT}(Gn) - T_{EPD}(Gn)$$

$T_{TOT}(Gn)$ is etch time of nth group
$T_{EPD}(Gn)$ is EPD time of nth group

Referring to 52 of FIG. 6, a relation graph of FIG. 7 can be achieved from relation between the over-etch time and the EPD time of n groups. A correlation function is obtained from the relation graph. For example, the values are illustrated as points in the graph drawn as a line 54 using interpolation. From the line 54, a function of over-etch time to EPD time (i.e., $T_{OE}(Gn)=f(T_{EPD}(Gn))$) can be achieved.

As explained above, the present invention may control CD regardless of exposure ratio. Exemplary embodiments of the present invention are described for fabricating a photo mask.

According to at least one embodiment of the present invention, uniform dimensional displacement, regardless of exposure ratio, can be achieved using a function of over-etch time to EPD time. Therefore, dimensional displacement can be predicted, such that the dimensional displacement can be fitted to design a pattern. A method for controlling CD of the present invention is effective for forming photo masks having a desired pattern in a process for forming a photo mask. In addition, using EPD time, CD can be controlled precisely by minimizing the effectiveness of process variables.

What is claimed is:

1. A method for controlling a critical dimension, comprising:
    defining a difference between a designed dimension and an etched dimension as a dimensional displacement;
    specifying a target value of the dimensional displacement;
    preparing a plurality of samples classified into groups according to exposure ratio;
    etching the samples of each group until an etch end point is detected and over-etching the samples of each group for different times according to a uniform time interval;
    selecting an end point detection time and an over-etch time of each group according to the target value of the dimensional displacement;
    determining a correlation function of end point time to over-etch time; and
    determining an over-etch time corresponding to the end point time using the correlation function.

2. The method of claim 1, wherein preparing the plurality of samples comprises:
    specifying an exposure ratio as a variable;
    specifying a uniform variable of each group; and
    preparing a plurality of samples in each group.

3. The method of claim 1, wherein etching the samples of each group comprises:
    determining a designed dimension of each group;
    etching samples in each group, wherein etching time applied to each sample is different;
    determining dimensions after etching the samples;
    determining dimensional displacement in each group; and
    selecting an etching time dimensional displacement of each group is substantially identical to the target value,
    wherein the end point is detected by an end point detector and the over-etch time is determined by subtracting the picked out end point detection time from the selected etching time.

4. The method of claim 1, wherein the etch end point is detected using optical emission spectrometer.

5. The method of claim 1, wherein determining the correlation function comprises:
    determining a relation graph of the end point detection time and the over-etch time when the dimensional displacement is substantially identical to the target value; and
    determining the correlation function from the relation graph.

6. The method of claim 1, wherein the correlation function is implemented by an etching apparatus as an over-etching control function,
    wherein the over-etching control function determines the over-etch time corresponding to the detected end point detection time using the correlation function and commands to carry out over-etch process during the determined over-etch time.

7. The method of claim 1, wherein the determining over-etch time corresponding to the end point, further comprises:
    forming a photoresist pattern on a substrate with material layer;
    using the photoresist pattern as an etch mask, etching the material layer and detecting end point time using end point detector; and
    feeding the end point time to the correlation function to calculate over-etch time, and performing over-etching during the determined over-etch time.

8. The method of claim 7, wherein the step of etching is performed in etching apparatus fed with the correlation function, and
    wherein the etching apparatus calculates over-etch time by feeding end point detection time to the correlation function when end point is detected, and outputs etch commands during the over-etch time.

9. The method of claim 7, wherein the end point is detected by an optical emission spectrometer.

* * * * *